United States Patent [19]

Kurata et al.

[11] Patent Number: 5,667,583
[45] Date of Patent: Sep. 16, 1997

[54] METHOD OF PRODUCING A SINGLE CRYSTAL OF A RARE-EARTH SILICATE

[75] Inventors: Yasushi Kurata; Kazuhisa Kurashige; Hiroyuki Ishibashi, all of Tsukuba, Japan

[73] Assignee: Hitachi Chemical Co. Ltd., Japan

[21] Appl. No.: 413,287

[22] Filed: Mar. 30, 1995

[30] Foreign Application Priority Data

| Mar. 30, 1994 | [JP] | Japan | 6-059671 |
| Mar. 30, 1994 | [JP] | Japan | 6-059672 |
| Mar. 30, 1994 | [JP] | Japan | 6-059673 |

[51] Int. Cl.⁶ ............................................. C30B 15/36
[52] U.S. Cl. ............................ 117/13; 117/211; 117/902; 117/937
[58] Field of Search ................... 117/13, 902, 923, 117/937, 942, 211, 910

[56] References Cited

FOREIGN PATENT DOCUMENTS

| 3-80183A | 4/1991 | Japan. |
| 4-175297A | 6/1992 | Japan. |

*Primary Examiner*—Felisa Garrett
*Attorney, Agent, or Firm*—Pennie & Edmonds

[57] ABSTRACT

A method of growing a single crystal of a rare-earth silicate is disclosed which comprises heating raw materials in a crucible to thereby obtain a melt of the raw materials, contacting a lower end of a seed crystal with the melt and pulling the seed crystal to thereby grow a single crystal, and wherein the pulling is conducted along an axis of pulling having a gradient of at least 30° from the b-axis ([010] axis) of the single crystal and a gradient of at least 25° from the c-axis ([001] axis) of the single crystal. The invention also provides a method of machining a single crystal of a rare-earth silicate into a cylindrical form, comprising grinding a cylinder whose axis is directed so as to have a gradient of 0° to 65° from the c-axis ([001] axis) of the single crystal. Further, the invention provides a single crystal of a rare-earth silicate machined into a configuration having at least one plane, wherein the plane most close to the (100) plane of the single crystal has a gradient of at least 5° from the (100) plane.

3 Claims, 2 Drawing Sheets

METHOD OF PRODUCING A SINGLE CRYSTAL OF A RARE-EARTH SILICATE

BACKGROUND OF THE INVENTION

1. Field of The Invention

The present invention relates to a method of growing a single crystal of a rare-earth silicate, a method of machining a single crystal of a rare-earth silicate into a cylindrical form, a single crystal of a rare-earth silicate machined into a configuration having at least one plane e.g. mirror-finished plane) and a process for producing a single crystal of a rare-earth silicate having at least one plane. The single crystal is used in, for example, X-ray detectors as scintillators and other electronic equipments.

2. Description of Related Art

The single crystal of a rare-earth silicate such as gadolinium oxyorthosilicate is now widely being used in scintillators, phosphors and the like.

The gadolinium oxyorthosilicate single crystal belonging to monoclinic system can be produced from a melt of raw materials according to the Czochralski technique. That is, the single crystal can be produced by heating raw materials in a crucible to thereby obtain a melt of the raw materials, contacting a seed crystal with the melt and pulling the seed crystal to thereby grow a single crystal on the seed crystal. For use in scintillators and the like, the single crystal is generally machined into a cylindrical or rectangular-parallelepipedic shape. In practice, further, mirror-finish polishing is effected on at least one plane of the single crystal, a reflector is coated on or wound round the planes of the single crystal except one mirror-finished plane, and the reflector-free plane is fitted onto a photomultiplier prior to use.

However, the gadolinium oxyorthosilicate single crystal belonging to monoclinic system has the property of cleaving along the a-plane ((100) plane) and also the anisotropy that the coefficient of thermal expansion along the direction of the b-axis ([010] axis) is greater than those along other directions, so that not only is the single crystal likely to crack at the (100) and (010) planes during the cooling process for crystal growth but also new cracks are likely to occur during the machining thereof.

Methods for growing a crack-free single crystal of rare-earth silicate have been proposed, which include one aligning an axis of pulling so as to agree with the b-axis ([010] axis) of the single crystal or a vicinity thereof (a gradient of 0° to 30° from the b-axis) (Japanese Patent Application Laid-Open (KOKAI) No. 3-80183) and another aligning an axis of pulling so as to be parallel to the (100) plane and to have a gradient of 0° to 25° from the c-axis ([001] axis) (Japanese Patent Application Laid-Open (KOKAI) No. 4-175297).

However, these conventional methods have a problem that cracking still cannot be avoided during the cooling process of the growth of the single crystal of rare-earth silicate or during the machining of the single crystal.

Specifically, when the axis of pulling is aligned so as to agree with the b-axis ([010] axis) or a vicinity thereof, the seed crystal or grown crystal is cracked at a middle thereof during the cooling process of the growth, thereby causing the crystal to fall. Further, when a long cylindrical specimen is taken from the crystal grown in the above-mentioned direction, it is carried out along the length of the grown crystal (with the axis of the cylinder aligned so as to agree with the direction of the pulling axis). In taking the specimen, cracking is likely to occur during the cylinder grinding of the side face thereof, thereby disadvantageously lowering yield.

On the other hand, when the axis of pulling is aligned so as to agree with the [001] axis or a vicinity thereof, cleavage occurs during the grinding of a plane perpendicular to the direction of pulling in machining the specimen taken from the grown crystal. For avoiding the cracking of the specimen face, it is required that the specimen be taken with the center axis of the specimen held at a substantial gradient from the direction of the pulling axis. This disadvantageously lowers the specimen yield and complicates the operation.

As mentioned above, when the gadolinium oxyorthosilicate single crystal or the like belonging to monoclinic system is used in scintillators and the like, it generally has a cylindrical or rectangular-parallelepipedic shape. In practice, further, mirror-finish polishing is effected on at least one plane of the single crystal, a reflector is coated on or wound round the planes of the single crystal except one mirror-finished plane, and the reflector-free plane is fitted onto a photomultiplier prior to use.

The above-mentioned single crystal has strong cleaving properties and thus is likely to crack at the (100) plane. Hence, it is a relatively brittle crystal, thereby being likely to suffer from cracking during the cooling for crystal growth or the machining operation. Despite the above-mentioned properties, a cylinder grinding of the side face of the single crystal has been carried out with the axis of the cylinder aligned so as to agree with any arbitrary crystal orientation between the b-axis ([010] axis) and the c-axis ([001] axis) in the machining of the single crystal of rare-earth silicate such as gadolinium oxyorthosilicate into a cylindrical form.

This conventional method has a problem that cracks and peels are likely to occur at the side face during the cylinder grinding, thereby rendering a stable formation of smooth side surface unfeasible.

Further, when the gadolinium oxyorthosilicate single crystal or the like belonging to monoclinic system is used in scintillators and the like, generally, a cylindrical or rectangular-parallelepipedic single crystal is machined into a configuration having at least one plane prior to use.

The above-mentioned single crystal has strong cleaving properties and thus is likely to crack at the (100) plane. Hence, it is a relatively brittle crystal, thereby being likely to suffer from cracking during the cooling for crystal growth or the machining operation. In the machining into the configuration having at least one plane, generally, use is made of a technique machining the single crystal into a configuration having a plane parallel to a cleavage plane.

This conventional method has a problem that the cutting or grinding of the plane parallel to the cleavage plane is likely to cause cleavage plane peeling because the machined plane does not completely agree with the cleavage plane ((100) plane), thereby rendering obtaining a smooth machined surface unfeasible.

SUMMARY OF THE INVENTION

With a view toward obviating the above-mentioned drawbacks of the prior art, the inventors have made extensive and intensive studies. As a result, it has been found that a desirable method of growing a single crystal of rare-earth silicate is provided by effecting the crystal pulling along an axis having a specified gradient, that a desirable method of machining a single crystal of rare-earth silicate is provided by grinding a cylinder whose axis is directed with a specified gradient, that a desirable single crystal of rare-earth silicate is provided by machining into a configuration having a mirror-finished plane with a specified gradient, and that a desirable process for producing a single crystal of rare-earth silicate is provided by machining in a manner such that a plane has a specified gradient. The present invention has been completed on the basis of the above-mentioned unexpected findings.

It is, therefore, a first object of the present invention to provide a method of growing a single crystal of rare-earth silicate in which cracking does not occur during the crystal growth by virtue of the selection of the direction of the pulling axis, which is easily practiced, and in which a single crystal ensuring easy preparation of a specimen (machining into cylindrical shape) is obtained because of the less propensity to crack at the machining of the side face and the section (plane perpendicular to the direction of pulling) of the grown crystal.

It is a second object of the present invention to provide a method of machining a single crystal of rare-earth silicate into a cylindrical form, in which a smooth side face free of cracks and peels is obtained by performing a cylinder grinding of the side face with the axis of the cylinder aligned along a selected crystal orientation.

It is a third object of the present invention to provide a single crystal of rare-earth silicate having at least one smooth machined plane free of peels by further machining a single crystal of rare-earth silicate machined to have, for example, a cylindrical form into a configuration having at least one plane by means of a cut plane of selected angle disposed in the vicinity of the cleavage plane.

The foregoing and other objects, features and advantages of the present invention will become apparent from the following detailed description and appended claims taken in connection with the accompanying drawings.

In a first aspect of the present invention, it has been attained by studying the influence of the direction of the pulling axis on the propensity for cracks during growth and machining of a single crystal which is formed in a method of growing the single crystal of a rare-earth silicate comprising heating raw materials in a crucible to thereby obtain a melt of the raw materials, contacting a lower end of a seed crystal with the melt and pulling the seed crystal to thereby grow a single crystal, and by finding as a result of the study that the cracks during growth and machining can be prevented by conducting the pulling along an axis of pulling within a certain range between the b-axis ([010] axis) and the c-axis ([001] axis) of the single crystal (having a gradient of at least 30° from the b-axis and a gradient of at least 25° from the c-axis), preferably along an axis of pulling within said range and having a gradient of 0° to 25° from the (100) plane.

That is, in a first aspect of the present invention, there is provided a method of growing a single crystal of a rare-earth silicate comprising heating raw materials in a crucible to thereby obtain a melt of the raw materials, contacting a lower end of a seed crystal with the melt and pulling the seed crystal to thereby grow a single crystal, wherein the pulling is conducted along an axis of pulling having a gradient of at least 30° from the b-axis ([010] axis) of the single crystal, preferably along an axis of pulling having a gradient of at least 30° from the b-axis ([010] axis) of the single crystal, and a gradient of at least 25° from the c-axis ([001] axis) of the single crystal.

In a second aspect of the present invention, it has been attained by studying the relationship between the direction of the cylinder axis relative to the crystal orientation and the propensity to crack at the side face in a method of machining a single crystal of a rare-earth silicate into a cylindrical form, and by finding as a result of the study that the crystal cracks and peels can be prevented by grinding a cylinder whose axis is directed so as to have a gradient of 0° to 65° from the c-axis ([001] axis) of the single crystal.

The second aspect of the present invention is particularly suitable to machine a single crystal grown by the method according to the first aspect of the present invention into cylindrical form.

In a third aspect of the present invention, it has been attained by studying the relationship between the gradient of the machined plane from the cleavage plane ((100) plane) and the propensity for peels in cutting a single crystal of a rare-earth silicate, and by finding as a result of the study that cleavage plane peels can be prevented as long as the machined plane has a gradient of at least 5° from the cleavage plane ((100) plane) even if the machined plane is slipped from the cleavage plane.

The third aspect of the present invention is particularly suitable to cut a single crystal grown by the method according to the first aspect of the present invention into cylindrical form.

In connection with the first aspect of the present invention, the reason why the cracks during growth and machining can be prevented by conducting the pulling along an axis of pulling within a certain range between the b-axis ([010] axis) and the c-axis ([001] axis) of the single crystal, preferably along an axis of pulling within said range, having a gradient of 0° to 25° from the (100) plane in a method of growing a single crystal of a rare-earth silicate comprising heating raw materials in a crucible to thereby obtain a melt of the raw materials, contacting a lower end of a seed crystal with the melt and pulling the seed crystal to thereby grow a single crystal would be as follows.

A study of the material mechanics properties of a single crystal of rare-earth silicate has showed that the coefficient of thermal expansion along the direction of the [001] axis is greater than those along other directions. Therefore, when the axis of pulling agrees with the [010] axis or a vicinity thereof, the temperature gradient is greater along the direction of the [010] axis, so that the seed crystal or grown crystal would be cracked at a middle thereof during the growth thereof due to thermal stress, thereby causing a crystal fall. Thus, for preventing the crystal fall, it is desired to cause the gradient of the pulling axis from the [010] axis to be a certain angle or greater.

Further, a recent study has newly showed that plastic deformation is induced in a single crystal of rare-earth silicate when a perpendicular load is applied to the cleavage plane ((100) plane) to thereby exert a tensile stress along the direction of the [001] axis, and that the fracture toughness along the cleaving direction is about one figure smaller on the plane normal to the [001] axis than on the (010) plane, so that the propensity for cleaving is much greater from the plane normal to the [001] axis than from the (010) plane. When a cylindrical specimen prolonged in the longitudinal direction is taken from the crystal pulled along an axis close to the [010] axis, the plane close to the plane normal to the [001] axis (plane with a smaller gradient) forms the side face, so that cleaving and cleavage plane peels are likely to occur, because of the above-mentioned anisotropic properties regarding to the cleavage plane. Therefore, for preventing side face cracking and peels at the cylinder grinding, it is desired to cause the gradient of the pulling axis from the [010] axis to be a certain angle or greater.

On the other hand, when the pulling is conducted along an axis close to the [001] axis, the plane close to the plane normal to the [001] axis (plane having a smaller gradient) becomes perpendicular to the direction of pulling. Therefore, when cutting is conducted at this readily machinable plane and a specimen is taken, the grinding of the plane invites cleavage due also to the above-mentioned anisotropy of fracture toughness of cleavage. Therefore, it is desired to cause the gradient of the pulling axis from the [001] axis to be a certain angle or greater, for preventing the cracking at grinding even if a specimen is taken on the plane perpendicular to the pulling axis, i.e., for obtaining a grown crystal having crystal orientation convenient for specimen taking (high yield).

With respect to the relationship between the (100) plane with cleaving properties and the pulling axis, when the pulling is conducted along an axis close to the direction normal to the (100) plane, as when being close to the [010] axis, the problem of crystal fall due to the cracking of the plane nearly perpendicular to the pulling axis occurs with a propensity greater than the cracking of the (010) plane. Therefore, the crystal growth is most easy when the pulling is conducted along an axis directed so as to be parallel to the (100) plane. However, the crystal growth is feasible and the crystal can be machined without any disadvantage as long as the gradient from the pulling axis is within the range of 0° to 25°. Accordingly, the above-mentioned gradient of the pulling axis can be selected as being appropriate.

The above-mentioned matters would be the reason for the stable prevention of the cracks during growth and machining attained by conducting the pulling along an axis having a gradient of at least 30° from the b-axis ([010] axis) and a gradient of at least 25° from the c-axis ([001] axis), preferably along an axis of pulling having a gradient of at least 30° from the b-axis ([010] axis) and a gradient of at least 25° from the c-axis ([001] axis), and a gradient of 0° to 25° from the (100) plane.

The growing method according to the first aspect of the present invention ensures the easy growth and machining of a single crystal of rare-earth silicate without the occurrence of cracking during crystal growth and cooling and without the occurrence of cracking during machining, in particular, cylinder cutting and grinding.

In connection with the second aspect of the present invention, the reason why the crystal cracks and peels can be prevented by grinding a cylinder whose axis is directed so as to have a gradient of 0° to 65° from the c-axis ([001] axis) of the single crystal in a method of machining a single crystal of a rare-earth silicate into a cylindrical form would be as follows.

A study of the material mechanics properties of a single crystal of rare-earth silicate has showed that the single crystal has a direction exhibiting plastic deformation. This plastic deformation is induced in a single crystal of rare-earth silicate when a perpendicular load is applied to the cleavage plane ((100) plane) to thereby exert a tensile stress along the direction of the [001] axis. It has further been found that the fracture toughness along the cleaving direction is about one figure smaller on the plane normal to the [001] axis than on the (010) plane, so that the propensity for cleaving is greater from the plane normal to the [001] axis than from the (010) plane.

In view of the above-mentioned material properties of the single crystal of rare-earth silicate, the propensity to crack and peel along the cleavage plane would be great when a cylinder grinding is conducted with the axis of the cylinder directed so as to agree with the direction of the [010] axis because the direction of the [001] axis agrees with the diametrical direction of the cylinder. Thus, the greater the slippage of the direction of the [001] axis from the diametrical direction of the cylinder toward the direction of the [010] or [100] axis, the less the propensity to crack or peel at the side face. In practice, the cracking can be prevented by the slippage of a certain angle or greater. That is, the cracking and peeling of the side face can be securely prevented by grinding a cylinder whose axis is directed so as to have a gradient of 0° to 65° from the c-axis ([001] axis) of the single crystal.

In the mirror-finish polishing of the bottom of a cylindrical body, when the machining is conducted at a small angle between the bottom and the plane normal to the [001] axis, cleavage ((100) plane) is likely to occur. Therefore, it is desirable to direct the axis of the cylinder so as to have a gradient of at least 15° from the [001] axis.

With respect to the relationship between the cleavage plane ((100) plane) and the axial direction of the cylinder, it is most desirable to align the axial direction of the cylinder in parallel to the (100) plane from the viewpoint of the strength of the machined cylindrical specimen against external mechanical shock.

A crack-free cylindrical specimen can be securely obtained by the machining according to the second aspect of the present invention. Further, if the direction of the seed crystal (pulling axis) is grasped in advance, machining can be effected without time-consuming orientation determination.

In connection With the third aspect of the present invention, the reason why cleavage plane peels can be prevented by machining with the plane to be machined most close to the cleavage plane ((100) plane) directed so as to have a gradient of at least 5° from the cleavage plane in the machining of a single crystal of rare-earth silicate would be as follows.

A study of the material mechanics properties of a single crystal of rare-earth silicate has showed that the single crystal has a direction exhibiting plastic deformation. This plastic deformation is induced in a single crystal of rare-earth silicate when a perpendicular load is applied to the cleavage plane ((100) plane) to thereby exert a tensile stress along the direction of the [001] axis. It has further been found that the fracture toughness along the cleaving direction is about one figure smaller on the plane normal to the [001] axis than on the (010) plane, so that the propensity for cleaving is greater from the plane normal to the [001] axis than from the (010) plane.

In view of the above-mentioned material properties of the single crystal of rare-earth silicate, the cleavage plane ((100) plane) is very likely to peel from the side of the (100) plane ((001)–17° plane). Therefore, when the plane being cutting machined is slightly slipped from the cleavage plane ((100) plane) (especially slipped toward a direction having a gradient from the [001] axis), the propensity for cleavage plane peels would be extremely high. However, the greater the slippage of the cutting-machined plane from the cleavage plane, the less probable would the cleavage plane peels be on the machined plane. In practice, the cleavage plane peels can be prevented by slipping the plane at a certain angle or over. That is, the cleavage plane peels can be securely prevented on the plane to be machined by machining with this plane directed so as to have a gradient of at least 5° from the cleavage plane ((100) plane).

A specimen having a machined plane close to the cleavage plane which is free of cleavage plane peels can be taken from a single crystal with cleavage plane by the single crystal machining method according to the third aspect of the present invention. Further, generally, the single crystal with cleaving properties is grown with the pulling axis directed so as to be parallel to the cleavage plane, so that the direction of the cleavage plane can readily be grasped. Thus, a specimen can be machined with morphologically high efficiency and without the need to perform time-consuming orientation determination.

Cleavage plane peels during machining would not occur as long as the above-mentioned gradient from the cleavage plane is not smaller than 5° but not greater than 90°.

The present invention is especially advantageously practiced with the use of the single crystal of gadolinium oxyorthosilicate.

However, the single crystal for use in the present invention is not limited to the single crystal of gadolinium oxyorthosilicate. The same effects as with the use of gadolinium oxyorthosilicate would be obtained with the use of another single crystal of a rare-earth silicate represented by the following general formula:

$$R_2SiO_5$$

wherein

R represents at least one rare-earth element selected from the group consisting of La, Ce, Pr, Nd, Pm, Sm, Eu, Tb, Dy, Ho, Er, Tm, Yb, Lu, Y and Sc, in view of the similarity in the mechanical properties of the crystals.

Further, the same effects would be obtained even if the above-mentioned single crystal of rare-earth silicate is doped with a rare-earth element such as Ce or a transition metal of the iron group such as Cr.

The above-mentioned single crystal of rare-earth silicate has the same crystal structure as that of the single crystal of gadolinium oxyorthosilicate, whose structure belongs to the space group P2/c.

PREFERRED EMBODIMENT OF THE INVENTION

The present invention will now be described in greater detail with reference to the following Examples and Comparative Examples, which should not be construed as limiting the scope of the invention.

Comparative Example 1

Herein, the growth of a single crystal of cerium-doped gadolinium oxyorthosilicate (Ce: $Gd_2SiO_5$ or "GSO") will be described as a typical comparative example.

About 3260 g of $Gd_2O_3$, about 540 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochralski technique. The pulling of the seed crystal was conducted along the [010] axis at a rate of 1 to 3 mm/hr. The seed crystal was rotated at a rotation rate of 30 to 50 rpm.

Figure 2:
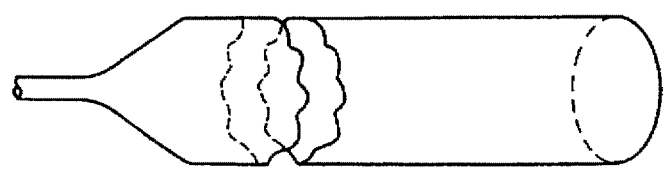
FIG. 2 is a perspective view of the grown crystal obtained by the growth in Comparative Example 1.

The grown single crystal was cut out and cooled to room temperature over a period of 20 to 60 hr. However, during the cooling, a top portion of the cylindrical body of the single crystal suffered from a crack nearly perpendicular to the pulling axis with the result that the portion of the single crystal below the crack fell (FIG. 2). This crystal fall occurred at a probability of 90% or higher.

The above-mentioned cylindrical body of the crystal means a portion of the crystal grown after the increase of the diameter of the crystal from that of the seed crystal to a target diameter in the growth of a single crystal comprising contacting a lower end of a seed crystal with a melt and pulling the seed crystal to thereby grow a single crystal.

A sampling of a crystal of 40 mm in diameter and 120 mm in length was attempted from a crack-free potion of the grown crystal. The grown crystal was cut to a length of about 120 mm along the pulling axis thereof, and the side face was ground by means of a cylinder grinder to thereby obtain a cylinder of 40 mm in diameter. The side face of the cylinder suffered from cracks and peels along the cleavage plane ((100) plane) (see FIG. 3).

Comparative Example 2

A single crystal of GSO was produced according to the Czochralski technique in the same manner as in Comparative Example 1. The pulling of the seed crystal was conducted along the [001] axis at a rate of 1 to 3 mm/hr. The seed crystal was rotated at a rotation rate of 30 to 50 rpm.

The thus grown single crystal was cut out and cooled to room temperature over a period of 20 to 50 hr. The cracking during the cooling was prevented at a probability of about 50%. A single crystal having a cylindrical body of 50 mm in diameter and 180 mm in length was obtained.

The grown crystal was subjected to cutting for sampling a crystal of 40 mm in diameter and 130 mm in length. The grown crystal was cut to a length of about 130 mm perpendicularly to the pulling axis thereof, and the side face was ground by means of a cylinder grinder to thereby obtain a cylinder of 40 mm in diameter having a crack-free side face. Thereafter, mirror-finish polishing was carried out. Although the side face was ground without cracking, the grinding of both the end faces (bottoms) thereof was accompanied by cracks along the cleavage plane ((100) plane) (see FIG. 4).

EXAMPLE 1

A single crystal of GSO was produced according to the Czochralski technique in the same manner as in Comparative Example 1. The pulling of the seed crystal was conducted along a direction having a gradient of 60° from the [010] axis and a gradient of 30° from the [001] axis and being parallel to the (100) plane. The pulling rate was 1 to 3 mm/hr, and the seed crystal was rotated at a rotation rate of 30 to 50 rpm.

The thus grown single crystal was cut out and cooled to room temperature over a period of 20 to 60 hr. The cracking during the cooling was prevented at a probability of about 80%. A single crystal having a cylindrical body of 50 mm in diameter and 180 mm in length was obtained.

The grown crystal was subjected to cutting for sampling a crystal of 40 mm in diameter and 130 mm in length. The grown crystal was cut to a length of about 130 mm perpendicularly to the pulling axis thereof, and the side face was ground by means of a cylinder grinder to thereby obtain a cylinder of 40 mm in diameter having a crack-free side face. Thereafter, mirror-finish polishing was carried out. All the side face and the end faces (bottoms) were successfully ground without cracking (see FIG. 1).

EXAMPLE 2

A single crystal of GSO was produced according to the Czochralski technique in the same manner as in Comparative Example 1. The pulling of the seed crystal was conducted along a direction having a gradient of 60° from the [010] axis, a gradient of 30° from the [001] axis and a gradient of 25° from the (100) plane. The pulling rate was 1 to 3 mm/hr, and the seed crystal was rotated at a rotation rate of 30 to 50 rpm.

The thus grown single crystal was cut out and cooled to room temperature over a period of 20 to 60 hr. The cracking during the cooling was prevented at a probability of about 60%. A single crystal having a cylindrical body of 50 mm in diameter and 180 mm in length was obtained.

The grown crystal was subjected to cutting for sampling a crystal of 40 mm in diameter and 130 mm in length. The grown crystal was cut to a length of about 130 mm perpendicularly to the pulling axis thereof, and the side face was ground by means of a cylinder grinder to thereby obtain a cylinder of 40 mm in diameter having a crack-free side face. Thereafter, mirror-finish polishing was carried out. All the side face and the end faces (bottoms) were successfully ground without cracking.

Comparative Example 3

Herein, the growth of a single crystal of cerium-doped gadolinium oxyorthosilicate (Ce: $Gd_2SiO_5$ or "GSO") will be described as a typical comparative example. A cylindrical single crystal specimen of 20 mm in diameter and 40 mm in length was machined.

Figure 3:
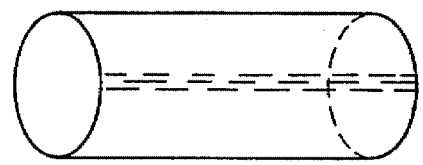
FIG. 3 is a perspective view of the crystal machined in Comparative Example 1.

A single crystal block having a size sufficient to provide a specimen of the desired dimensions was cut in an arbitrary direction to obtain a preliminary specimen having two 40 mm spaced faces destined to form bottoms of a cylinder. Subsequently, the side face of the preliminary specimen was longitudinally cut so that each of the faces destined to form cylinder bottoms (cross section) was shaped into a form close to a circle of 20 mm in diameter (polygon). Further, the side face of the resultant preliminary specimen was ground by means of a cylinder grinder. The side face of the cylinder (two mutually opposite positions) suffered from cracks and peels along the axis thereof (FIG. 3). The specimen was cut to examine the orientation determination thereof. As a result, it was found that the axis of the cylinder was directed at a gradient of 10° from the b-axis ([010] axis) toward the c-axis ([001]).

EXAMPLE 3

Herein, the growth of a single crystal of cerium-doped gadolinium oxyorthosilicate (Ce: $Gd_2SiO_5$ or "GSO") will be described as an embodiment of the present invention. A cylindrical single crystal specimen of 20 mm in diameter and 40 mm in length was machined.

Figure 4:
FIG. 4 is a perspective view of the crystal machined in Comparative Example 1.

A single crystal block having a size sufficient to provide a specimen of the desired dimensions was cut by the use of an X-ray cut surface inspection machine to obtain a preliminary specimen having two 40 mm spaced faces destined to form bottoms of a cylinder. The cutting was effected in a manner such that the axial direction of the specimen agreed with the direction of the c-axis ([001] axis). Subsequently, the side face of the preliminary specimen was longitudinally cut so that each of the faces destined to form cylinder bottoms (cross section) was shaped into a form close to a circle of 20 mm in diameter (polygon). Further, the side face of the resultant preliminary specimen was ground by means of a cylinder grinder. As a result, a crack-free cylindrical specimen was obtained. However, when mirror-finish polishing was conducted on the end faces of the cylinder, partial cleavages were observed (FIG. 4).

EXAMPLE 4

Herein, the growth of a single crystal of cerium-doped gadolinium oxyorthosilicate (Ce: Gd2SiO5 or "GSO") will be described as an embodiment of the present invention. A cylindrical single crystal specimen of 20 mm in diameter and 40 mm in length was machined.

Figure 1:
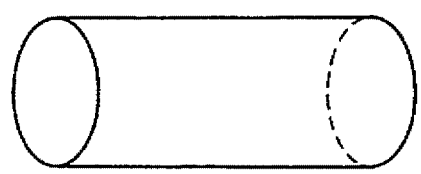
FIG. 1 is a perspective view of the grown crystal obtained by the growth in Example 1.

A single crystal block having a size sufficient to provide a specimen of the desired dimensions was cut by the use of an X-ray cut surface inspection machine to obtain a preliminary specimen having two 40 mm spaced faces destined to form bottoms of a cylinder. The cutting was effected in a manner such that the axial direction of the specimen agreed with a direction having a gradient of 45° from the c-axis ([001] axis) toward the b-axis ([010] axis). Subsequently, the side face of the preliminary specimen was longitudinally cut so that each of the faces destined to form cylinder bottoms (cross section) was shaped into a form close to a circle of 20 mm in diameter (polygon). Further, the side face of the resultant preliminary specimen was ground by means of a cylinder grinder. As a result, a crack-free cylindrical specimen was obtained. Still further, mirror-finish polishing was conducted on the end faces of the cylinder. No crack occurred (FIG. 1).

Comparative Example 4

Herein, the growth of a single crystal of cerium-doped gadolinium oxyorthosilicate (Ce: $Gd_2SiO_5$ or "GSO") will be described as a typical comparative example. A rectangular parallelepiped specimen of 20×20×10 $mm^3$ having two planes of 20×20 $mm^2$ was machined.

Figure 6:
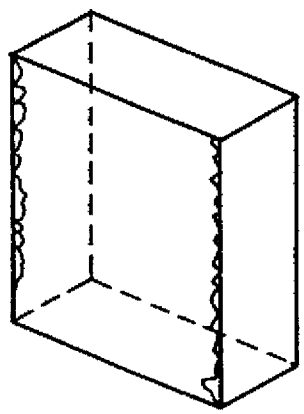
FIG. 6 is a perspective view of the crystal machined in Comparative Example 4.

A single crystal block having a size sufficient to provide a specimen of the desired dimensions which was grown by pulling along an axis of pulling parallel to the cleavage plane was cut with two pairs of mutually opposite planes which were mutually perpendicular to the cleavage of the cleavage plane ((100) plane) having occurred or caused to occur at an edge of the crystal block or the cleavage plane of the seed. Finally, the crystal block was cut with a pair of mutually opposite planes (20×20 $mm^2$) which were parallel to the cleavage plane. The plane which should have been cut in parallel to the cleavage plane suffered from peels at edges thereof after the cutting. Then, the plane was ground, but new peels occurred. Thus, smooth machined plane was not obtained (FIG. 6). An inspection of the plane by the use of an X-ray cut surface inspection machine showed slippages of 2° and 1°30' along arbitrary x- and y-directions, respectively.

EXAMPLE 5

With respect to the single crystal of cerium-doped gadolinium oxyorthosilicate, a rectangular parallelopiped specimen of 20×20×10 mm³ having two planes of 20×20 mm² was machined as in Comparative Example 4.

Figure 5:
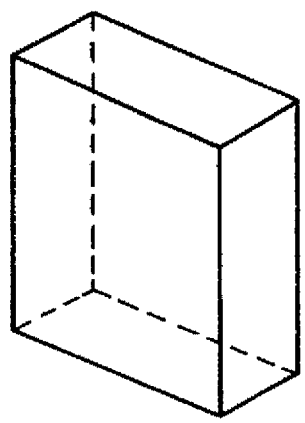
FIG. 5 is a perspective view of the crystal machined in Example 5.

A single crystal block having a size sufficient to provide a specimen of the desired dimensions which was grown by pulling along an axis of pulling parallel to the cleavage plane was cut with two pairs of mutually opposite planes which were mutually perpendicular to a plane having an appropriate gradient, toward an arbitrary direction, from a plane parallel to the cleavage of the cleavage plane ((100) plane) having occurred or caused to occur at an edge of the crystal block. Finally, the crystal block was cut with a pair of mutually opposite planes (20×20 mm²) which were parallel to the gradient plane. The machined plane most close to the above-mentioned cleavage plane was free from cleavage plane peels and also free from peels in the subsequent mirror-finish polishing, thereby providing a smooth machined plane (FIG. 5). An inspection of the plane by the use of an X-ray cut surface inspection machine showed slippages of 5° and 2° from the (100) plane along arbitrary x- and y-directions, respectively.

EXAMPLE 6

With respect to the single crystal of cerium-doped gadolinium oxyorthosilicate, a rectangular parallelopiped specimen of 20×20×10 mm³ having two planes of 20×20 mm² was machined as in Comparative Example 4.

A single crystal block having a size sufficient to provide a specimen of the desired dimensions which was grown by pulling along an axis of pulling parallel to the cleavage plane was cut with two pairs of mutually opposite planes which were mutually perpendicular to a plane having an appropriate gradient, toward an arbitrary direction, from a plane parallel to the cleavage of the cleavage plane ((100) plane) having occurred or caused to occur at an edge of the crystal block. Finally, the crystal block was cut with a pair of mutually opposite planes (20×20 mm²) which were parallel to the gradient plane. The machined plane most close to the above-mentioned cleavage plane was free from cleavage plane peels and also free from peels in the subsequent mirror-finish polishing, thereby providing a smooth machined plane (FIG. 5). An inspection of the plane by the use of an X-ray cut surface inspection machine showed slippages of 30° and 2° from the (100) plane along arbitrary x- and y-directions, respectively.

What is claimed is:

1. A method of growing a single crystal of a rare-earth silicate comprising heating raw materials in a crucible to thereby obtain a melt of the raw materials, contacting a lower end of a seed crystal with the melt and pulling the seed crystal to thereby grow a single crystal, wherein the pulling is conducted along an axis of pulling having a gradient of at least 30° from a b-axis ([010] axis) of the single crystal and a gradient of more than 25° from a c-axis ([001] axis) of the single crystal.

2. A process for producing a single crystal of a rare-earth silicate having at least one specular plane, which comprises a step for obtaining at least one specular plane by cutting and polishing a single crystal of a rare-earth silicate, wherein said specular plane has a gradient of at least 5° from said (100) plane.

3. A process for producing a single crystal of a rare-earth silicate having at least one specular plane, which comprises a growing step using the method of growing a single crystal of a rare-earth silicate as defined in claim 1 and further comprises a step for obtaining at least one specular plane by cutting and polishing said single crystal of a rare-earth silicate obtained in said growing step, wherein said specular plane has a gradient of at least 5° from a (100) plane.

* * * * *